(12) United States Patent
Fritz et al.

(10) Patent No.: US 12,713,962 B2
(45) Date of Patent: Aug. 18, 2026

(54) SEMICONDUCTOR PACKAGES INCLUDING INTERFACE MEMBERS FOR WELDING

(71) Applicant: TEXAS INSTRUMENTS INCORPORATED, Dallas, TX (US)

(72) Inventors: Tobias Bernhard Fritz, Mainburg (DE); Marcus Rudolf Zimnik, Regensburg (DE)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 601 days.

(21) Appl. No.: 17/538,820

(22) Filed: Nov. 30, 2021

(65) Prior Publication Data

US 2022/0223488 A1 Jul. 14, 2022

Related U.S. Application Data

(60) Provisional application No. 63/136,238, filed on Jan. 12, 2021.

(51) Int. Cl.

| | |
|---|---|
| ***H10W 74/10*** | (2026.01) |
| ***G01L 1/18*** | (2006.01) |
| ***H10W 70/69*** | (2026.01) |
| *H10P 72/00* | (2026.01) |

(52) U.S. Cl.

CPC ............. *H10W 74/111* (2026.01); *G01L 1/18* (2013.01); *H10W 70/69* (2026.01); *H10P 72/0446* (2026.01)

(58) Field of Classification Search

CPC ................. H01L 23/3107; H01L 23/14; H01L 21/67144; H01L 23/562; H01L 23/3121; G01L 1/18; G01L 1/26; G01L 1/2293

USPC ........................................................ 257/415

See application file for complete search history.

(56) References Cited

U.S. PATENT DOCUMENTS 5,209,120 A * 5/1993 Araki .................... G01L 19/147 73/706
5,948,992 A * 9/1999 Yamamoto .......... G01L 19/0084 73/754
6,674,178 B1 * 1/2004 Ikegami .................. H01L 24/83 257/E21.511
8,033,009 B2 * 10/2011 Kuriyama ............. G01L 1/2268 29/829
8,319,335 B2 * 11/2012 Bayerer .............. H01L 23/4952 257/565

(Continued)

OTHER PUBLICATIONS

First Office Action in corresponding China App. No. 202210020978.9, issued Apr. 22, 2026, 18 pgs.

*Primary Examiner* — Vu A Vu

(74) *Attorney, Agent, or Firm* — Zhenhai Fu; Frank D. Cimino

(57) ABSTRACT

An example semiconductor package includes a semiconductor die. In addition, the semiconductor package includes a mold compound having a first side, a second side opposite the first side, and an axis extending between the first side and the second side, the mold compound covering the semiconductor die. Further, the semiconductor package includes an interface member including a first portion and a second portion, the first portion is coupled to the second portion. The first portion is positioned along the first side, the second portion is positioned along the second side, and an engagement of a welding horn with the first portion is adapted to weld the second portion to a surface.

23 Claims, 9 Drawing Sheets

(56) References Cited

U.S. PATENT DOCUMENTS

| | | | | |
|---|---|---|---|---|
| 10,132,705 | B2 * | 11/2018 | Stefanescu | G01L 19/145 |
| 10,249,552 | B2 * | 4/2019 | Choi | H01L 23/3121 |
| 10,624,214 | B2 * | 4/2020 | Salehi | H05K 3/284 |
| 11,146,893 | B2 * | 10/2021 | Drljaca | H04R 31/006 |
| 2006/0147571 | A1 * | 7/2006 | Evers | H01L 21/565<br>425/129.1 |
| 2011/0228506 | A1 * | 9/2011 | Chen | H01L 22/32<br>361/810 |
| 2012/0061880 | A1 * | 3/2012 | Han | B29C 45/568<br>264/272.17 |
| 2013/0175704 | A1 * | 7/2013 | Jeun | H01L 23/3735<br>257/E23.116 |
| 2020/0385263 | A1 * | 12/2020 | Lee | H04R 1/04 |

* cited by examiner

SEMICONDUCTOR PACKAGES INCLUDING INTERFACE MEMBERS FOR WELDING

CROSS-REFERENCE TO RELATED APPLICATIONS

The present application claims priority to U.S. Provisional Patent Application No. 63/136,238, which was filed Jan. 12, 2021, is titled "Ultrasonic Welding For Integrated Circuits," and is hereby incorporated herein by reference in its entirety.

BACKGROUND

Force sensors are useful to detect one or more forces experienced by a member of interest. In some instances, a force sensor may be useful to detect stress, torque, compression, strain, tension, etc. experienced by the member of interest (e.g., a shaft, strut, beam). To facilitate the detection of these forces, the force sensor (or some component thereof) is mounted to the member so forces experienced by the member may be transferred to the force sensor during operations.

SUMMARY

Some examples described herein include a semiconductor package. In some examples, the semiconductor package includes a semiconductor die, and a mold compound having a first side, a second side opposite the first side, and an axis extending between the first side and the second side, the mold compound covering the semiconductor die. In addition, the semiconductor package includes an interface member including a first portion and a second portion. The first portion is coupled to the second portion, the first portion is positioned along the first side, the second portion is positioned along the second side, and an engagement of a welding horn with the first portion is adapted to weld the second portion to a surface.

In some examples, the semiconductor package includes a semiconductor die that is configured to detect a force. In addition, the semiconductor package includes a mold compound having a first side, a second side opposite the first side, and an axis extending between the first side and the second side. The mold compound covers the semiconductor die. Further, the semiconductor package includes an interface member engaged along the second side of the mold compound and coupled to the semiconductor die. The interface layer includes a mounting pad that is exposed when viewed along the axis from the first side, and the mounting pad is adapted to engage with a horn of a welding device to secure the semiconductor package to a surface.

In some examples, the semiconductor package includes a semiconductor die that is configured to detect a force. In addition, the semiconductor package includes an interface member coupled to the semiconductor die. The interface layer includes a first portion that is to engage with a welding horn of a welding apparatus and a second portion that is to weld with a surface of a member of interest, the first portion and the second portion being positioned on opposing sides of the semiconductor die.

DETAILED DESCRIPTION

A force sensor may be mounted to a member of interest for detecting (e.g., directly, indirectly) forces within the member. The force sensor is mounted to the member of interest, and forces experienced by the member may be transferred to the force sensor via the mounting. Some mounting devices or techniques may dampen or absorb forces that are transferred from the member of interest thereby causing the force sensor to be less effective at detecting these forces during operations. Thus, mounting the force sensor to the member of interest may have a meaningful effect on the quality of data that may be obtained by the force sensor during operations.

Welding techniques, such as ultrasonic welding, offer a quality connection between a force sensor and a member of interest that may allow forces to transfer efficiently and accurately from the member of interest to the force senor during operations. However, the vibrations resulting from ultrasonic welding may damage a force sensor.

Accordingly, examples described herein include force sensors that are subjectable to ultrasonic welding processes in order to secure the force sensor to a member of interest (e.g., a rotating shaft, structural beam). In some examples, the force sensors may include an interface layer that is adapted to melt and weld to a mounting surface on the member of interest and to direct vibrations of the welding process away from sensitive components of the force sensor (e.g., semiconductor die, wire bonds, die pad) during a welding operation. Thus, the force sensors described herein may be securely attached to a member of interest via ultrasonic welding without causing damage to the force sensor.

Figure 1:
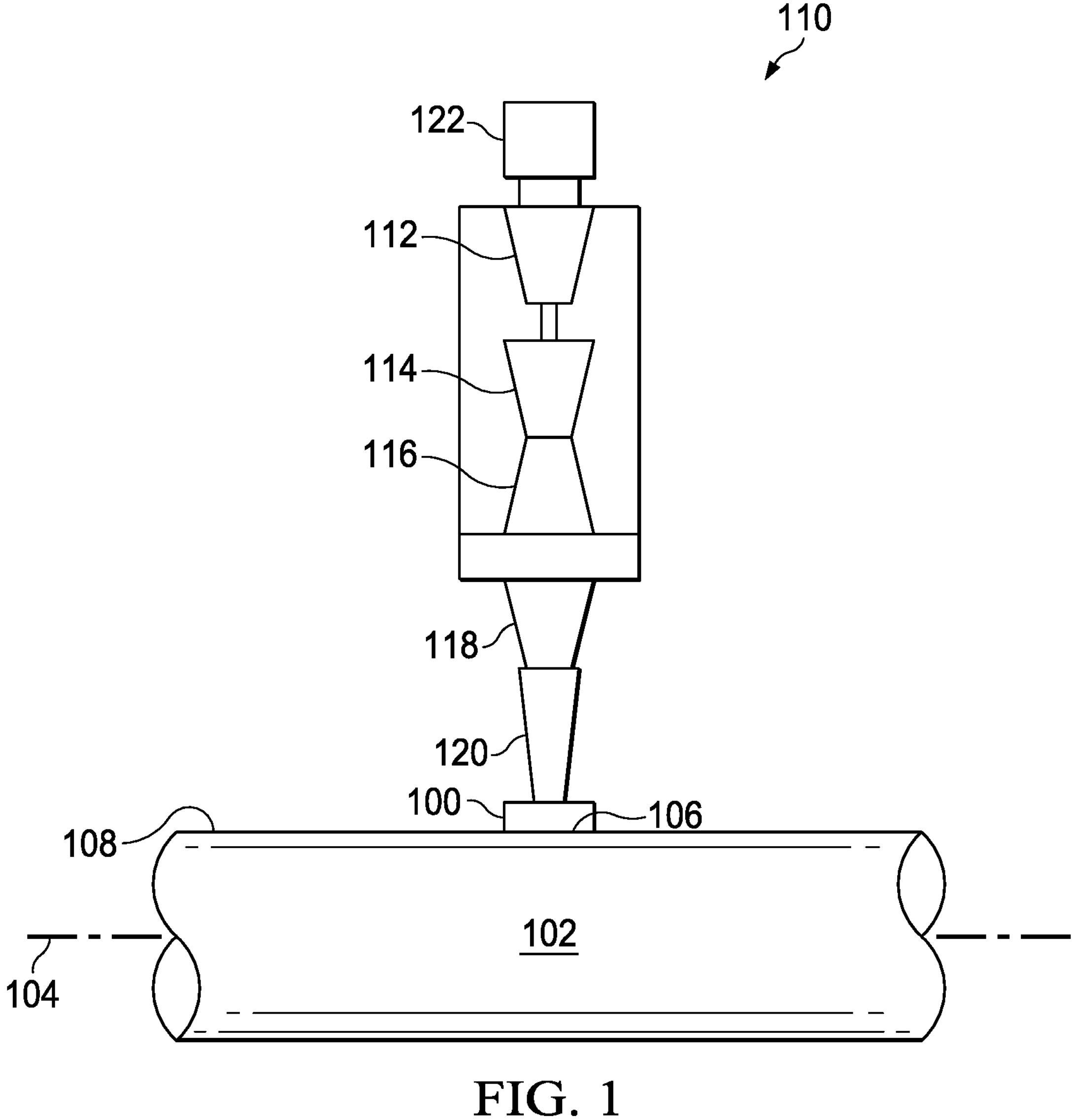
FIG. 1 is a side view of a force sensor coupled to a shaft with an ultrasonic welding apparatus according to some examples.

Referring now to FIG. 1, a force sensor 100 according to some examples is shown mounted to a shaft 102 that is rotatable about a central or longitudinal axis 104. The shaft 102 may be a rotating shaft of a pump, compressor, drivetrain or other mechanical system. The force sensor 100 is mounted to a mounting surface 106 which may include a planar or facetted surface that is defined on the otherwise curved outer surface 108 of shaft 102.

During operations, the force sensor 100 may detect, via the engagement with mounting surface 106, the forces experienced by the shaft 102. For instance, the shaft 102 may experience a torque about longitudinal axis 104, axial stress (e.g., from tension or compression along longitudinal axis 104), bending stress, strain, etc. These various forces and stresses that may be experienced by the shaft 102 may be collectively and generally referred to herein as "forces." The force sensor 100 may detect (e.g., directly or indirectly) any one or more of these forces during operations thereby allowing personnel to monitor the operating conditions of the shaft 102.

In some examples, the force sensor 100 may be welded to the mounting surface 106 with an ultrasonic welding apparatus 110. The ultrasonic welding apparatus 110 includes a transducer 112, a converter 114, a booster 116, a sonotrode 118, and a welding horn 120. The transducer 112 and converter 114 are adapted to convert an electrical signal (e.g., a high frequency electrical signal) into vibrations. The vibrations are transferred to the booster 116 which may transform and boost the amplitude of vibrations that are subsequently transferred to the sonotrode 118. The sonotrode 118 may be integrated with or coupled to the welding horn 120. During operations, the sonotrode 118 and welding horn 120 may vibrate based on the output from booster 116. A piston 122 may apply pressure to the ultrasonic welding apparatus 110 that presses the welding horn 120 into the force sensor 100. With welding horn 120 pressed into engagement with force sensor 100, the vibrations of welding horn 120 may cause the force sensor 100 (or a member or component thereof) to be welded to the mounting surface 106 of shaft 102. Further details of the ultrasonic welding process and the structure of examples of force sensor 100 that facilitate the ultrasonic welding process are provided below.

Figure 2A:
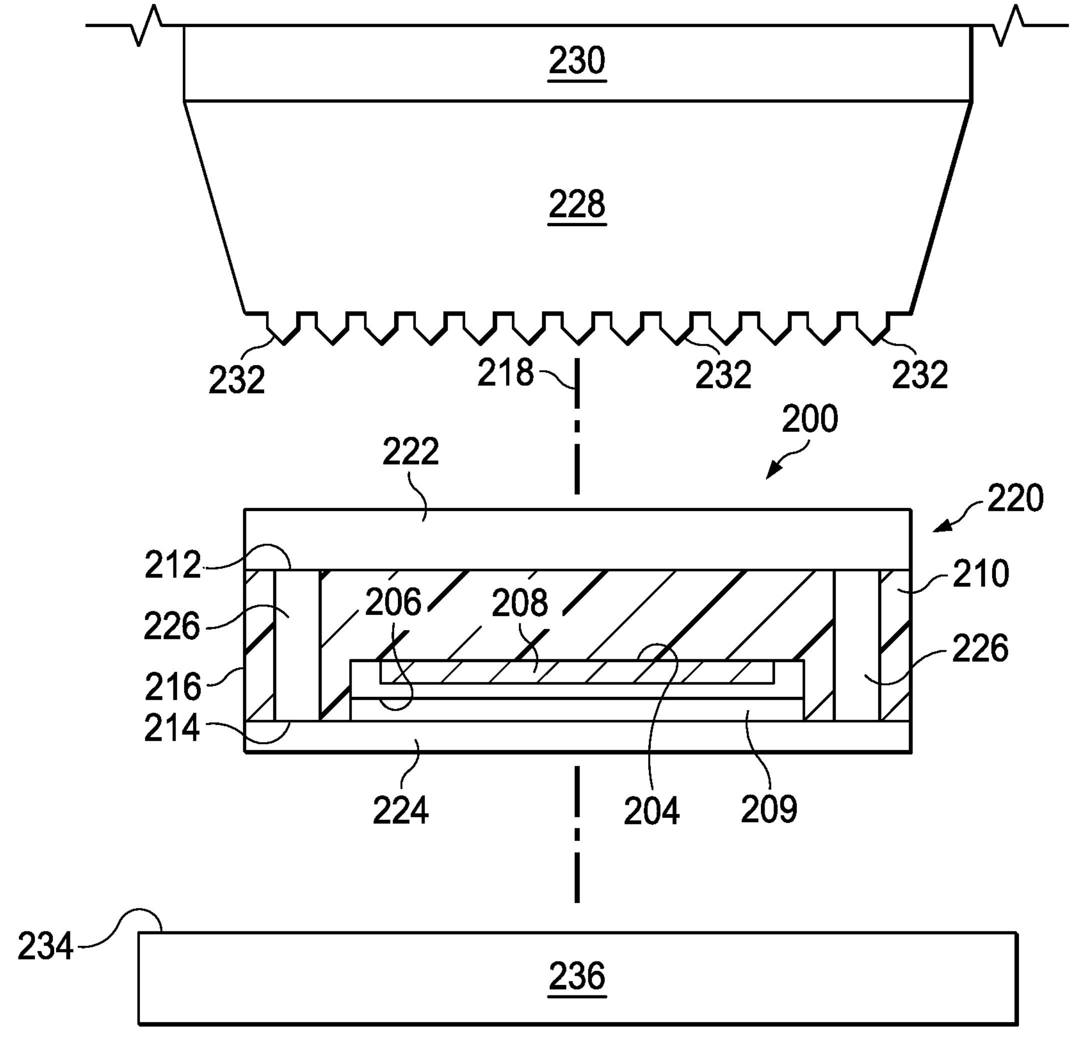
FIG. 2A is a side cross-sectional view of a force sensor for mounting to a member of interest according to some examples.
Figure 2B:
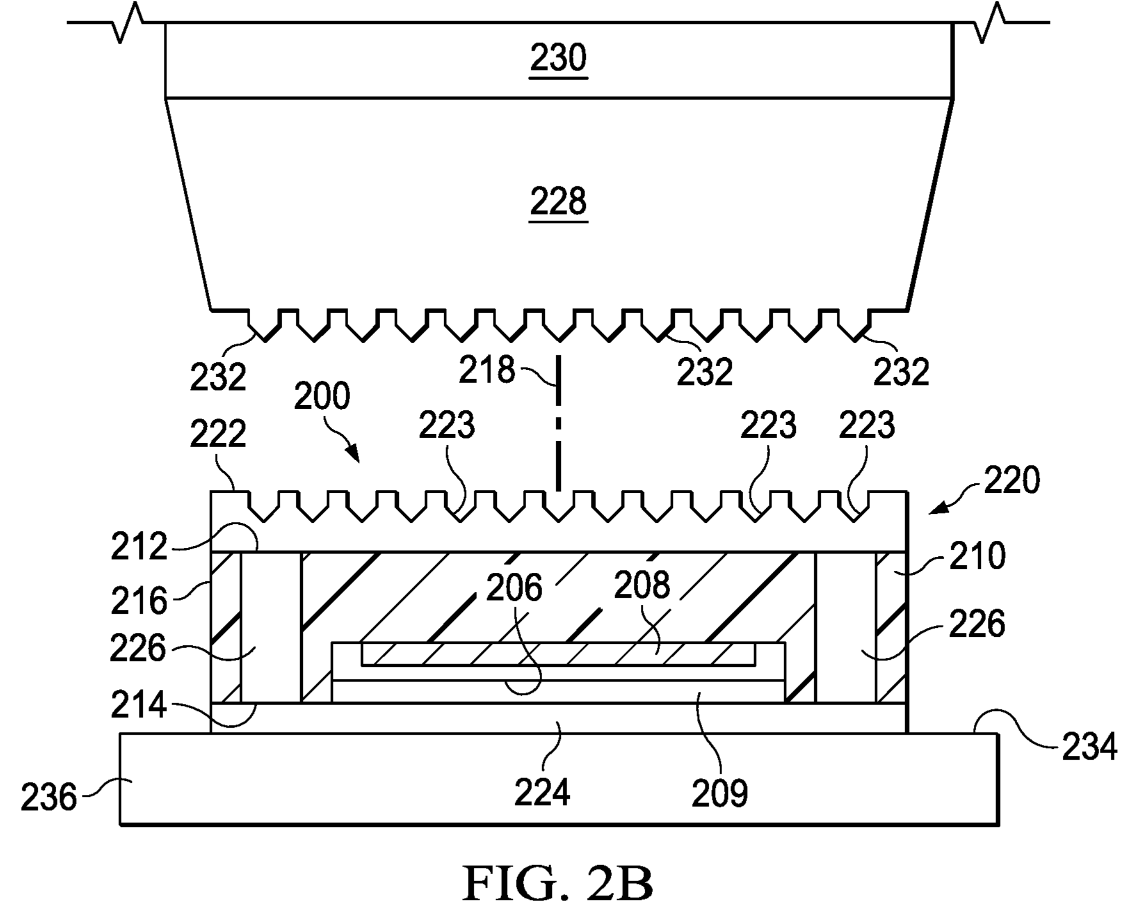
FIG. 2B is a side cross-sectional view of a force sensor mounted to a member of interest according to some examples.

Referring now to FIGS. 2A and 2B, a force sensor 200 that may be the force sensor 100 of FIG. 1 is shown according to some examples. FIGS. 2A and 2B show cross-sectional views of the force sensor 200 before and after, respectively, an ultrasonic welding operation. FIGS. 2A-2D may be collectively referred to herein as "FIG. 2."

The force sensor 200 is a semiconductor package that includes a semiconductor die 202. Accordingly, the force sensor 200 may be referred to herein as a "semiconductor package." The semiconductor die 202 has a device side 204 and non-device side 206 opposite the device side 204. An active circuit 208 (or more simply "circuit 208") is formed on the device side 204. The non-device side 206 of semiconductor die 202 is secured to a die pad 209 via a die attach layer (not shown) (e.g., solder paste, die attach adhesive, or similar semiconductor mounting technology).

A mold compound 210 (e.g., a polymer or resin material) may cover the semiconductor die 202 and die pad 209. The mold compound 210 may protect the semiconductor die 202 and die pad 209 from the outside environment (e.g., specifically from dust, liquid, light, contaminants in the outside environment), and may prevent undesired contact with conductive surfaces or members during operations. As referred to herein, the term "mold compound" includes a covering for a semiconductor die that is formed through any suitable process, such as a cavity molding operation, glob encapsulation, dam-and-fill type encapsulation, ceramics, etc. The mold compound 210 may include a first side 212, a second side 214 opposite first side 212, and an outer perimeter 216 extending between the first side 212 and the second side 214 along an axis 218 that extends through (e.g., perpendicularly through) the sides 212, 214.

The force sensor 200 also includes an interface member 220 that includes a first portion 222 and a second portion 224. The first portion 222 is coupled to and positioned along the first side 212 of mold compound 210, and the second portion 224 is coupled to and positioned along second side 214 of mold compound 210. Thus, the first portion 222 and the second portion 224 are spaced from one another along axis 218 and are positioned on opposing sides of the semiconductor die 202. The first portion 222 and the second portion 224 may be layers of material that are engaged with and may cover the first side 212 and second side 214, respectively, of mold compound 210. In some examples, the connection portions 226 may extend along the outer perimeter 216 between the first portion 222 and second portion 224.

The interface member 220 also includes multiple connection portions 226 that are coupled to and span (or extend) between the first portion 222 and the second portion 224. The connection portions 226 may extend axially between the first portion 222 and second portion 224 with respect to axis 218. The connection portions 226 may be columns or pillars of material that are coupled to and extend between first portion 222 and second portion 224, through the mold compound 210.

In some examples, the interface member 220 (including the first portion 222, second portion 224, and connection portions 226) may be formed of a material that may be joined to another surface or member (e.g., mounting surface 234 described below) via an ultrasonic welding process. For instance, in some examples the interface member 220 may be formed of a metallic material such as copper, aluminum, steel, carbon, etc. In some examples, the interface member 220 (including first portion 222, second portion 224, and connection portions 226) may be formed as a monolithic body that is made up of one continuous piece of material.

Referring specifically to FIG. 2B, during operations a welding horn 228 of an ultrasonic welding apparatus 230 (which may be similar to the ultrasonic welding apparatus 110 of FIG. 1) may be pressed against the first portion 212 and vibrated as described above. The welding horn 228 may include multiple patterned projections or spikes 232 that engage with the first portion 222 to transfer vibrations thereto. During an ultrasonic welding process, the welding horn 228 is vibrated as it is pressed against the first portion 212 and the vibrations are transferred from the first portion 222, through the connection portions 226 to the second portion 224. The pressure and vibrations of the second portion 224 against the mounting surface 234 of a member of interest 236 (e.g., shaft 102 of FIG. 1) cause the mounting surface 234 and second portion 224 to melt and weld to one another.

In addition, the pressure and contact between welding horn 228 and first portion 222 may cause distortion of the first portion 222 during the above-described ultrasonic welding process. In particular, the spikes 232 may dig into the first portion 222 and thereby form multiple recesses 223 in the first portion 222.

Without being limited to this or any other theory, the interface member 220 may conduct the vibrations axially through force sensor 200 along axis 218 without causing damage to the mold compound 210, semiconductor die 202, or die pad 209. Specifically, the interface member 220 is configured to route vibrations from welding horn 228 to pass through connection portions 226 to the second portion 224. Thus, the vibrations may bypass the mold compound 210, semiconductor die 202 and die pad 209 within force sensor 200. In addition, the placement of the first portion 222 along first side 212 of mold compound 210 provides access to the welding horn 228 along axis 218 during welding the force sensor 200 to mounting surface 234.

After force sensor 200 is welded to mounting surface 234, forces experienced by the member 236 may be transferred to the circuit 208 via the welded connection between second portion 224 of interface member 220 and mounting surface 234. The semiconductor die 202 may be configured to detect the transferred forces. In particular, the circuit 208 of semiconductor die 202 may detect the transferred forces via piezoresistive changes caused in the circuit 208 by the forces. The circuit 208 may also produce an output signal that includes (or is indicative of) the detected force(s). In some examples, the force sensor 200 may include additional components (e.g., semiconductor dies, passive components such as antennas, capacitors, resistors, etc.) that may process the output from the circuit 208 and/or communicate the output from the circuit 208 to other electronic devices (e.g., computers, semiconductor packages).

Figure 3A:
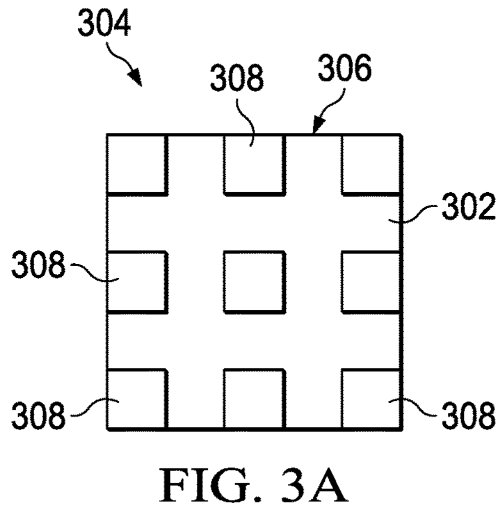
FIG. 3A is a bottom view of an interface member of a force sensor for mounting to a member of interest according to some examples.
Figure 3B:
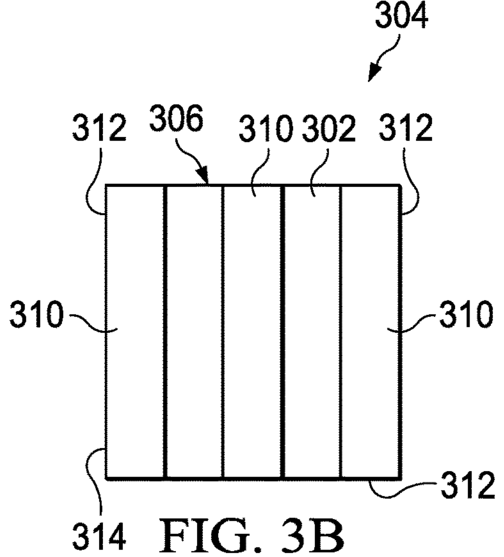
FIG. 3B is a bottom view of an interface member of a force sensor for mounting to a member of interest according to some examples.

Referring now to FIGS. 3A-3D, in some examples a second portion 302 of an interface member 304 of a force sensor 306 (e.g., second portion 224 of interface member 220 in FIGS. 2A and 2B) may include a patterned or textured surface (e.g., that may include a pattern of projections) for engagement with a mounting surface (e.g., mounting surface 234 in FIGS. 2A and 2B) of a member of interest (e.g., member 236 in FIGS. 2A and 2B). FIGS. 3A-3B may be collectively referred to herein as "FIG. 3." The force sensor 306 may comprise a semiconductor package, and thus may be more generally referred to herein as a "semiconductor package."

Referring specifically to FIG. 3A, in some examples the patterned surface on second portion 302 includes multiple spaced projections 308 that are evenly spaced from one another along the second portion 302. In some examples, the projections 308 may have a rectangular or square cross-section; however, any other suitable cross-sectional shape is contemplated for other examples (e.g., circle, oval, triangle). The second portion 302 may engage with a mounting surface via the projections 308. Accordingly, during an ultrasonic welding operation, the projections 308 may be welded to the mounting surface of a member of interest in the manner described above.

Figure 3C:
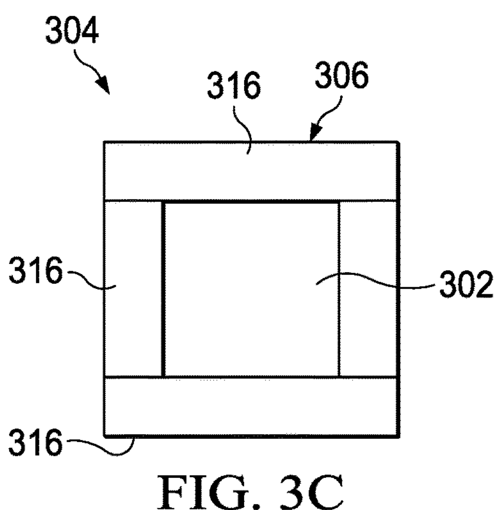
FIG. 3C is a bottom view of an interface member of a force sensor for mounting to a member of interest according to some examples.
Figure 3D:
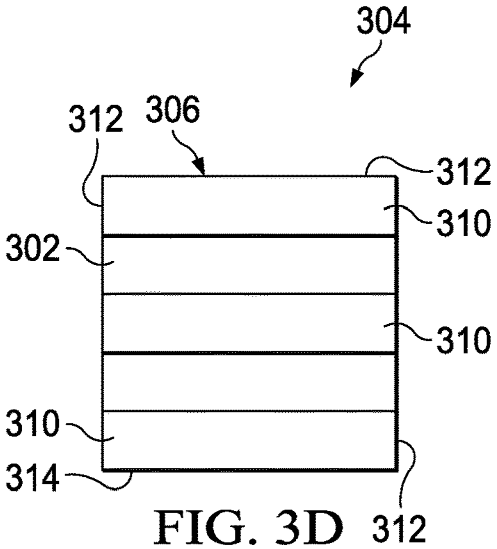
FIG. 3D is a bottom view of an interface member of a force sensor for mounting to a member of interest according to some examples.

Referring specifically to FIGS. 3B and 3D, in some examples the pattern of projections on second portion 302 includes elongate projections 310 that extend between opposing sides 312 of an outer perimeter 314 of second portion 302. FIG. 3B shows the elongate projections 310 extending between a first pair of opposing sides 312 along outer perimeter 314, and FIG. 3D shows the elongate projections 310 extending between a second pair of opposing sides 312 of outer perimeter 314. The second portion 302 may engage with a mounting surface via the elongate projections 310. Accordingly, during an ultrasonic welding operation, the projections 310 may be welded to the mounting surface of a member of interest in the manner described above.

Referring specifically to FIG. 3C, in some examples the pattern of projections on second portion 302 includes border projections 316 that extend along one or more (or all) of the sides 312 of outer perimeter 314. In some examples, the border projections 316 may extend continuously about the entire outer perimeter 314 as shown in FIG. 3C, or may extend about a portion (e.g., less than all) of the outer perimeter 314. The second portion 302 may engage with a mounting surface via the elongate projections 316. Accordingly, during an ultrasonic welding operation, the projections 316 may be welded to the mounting surface of a member of interest in the manner described above.

Figure 4:
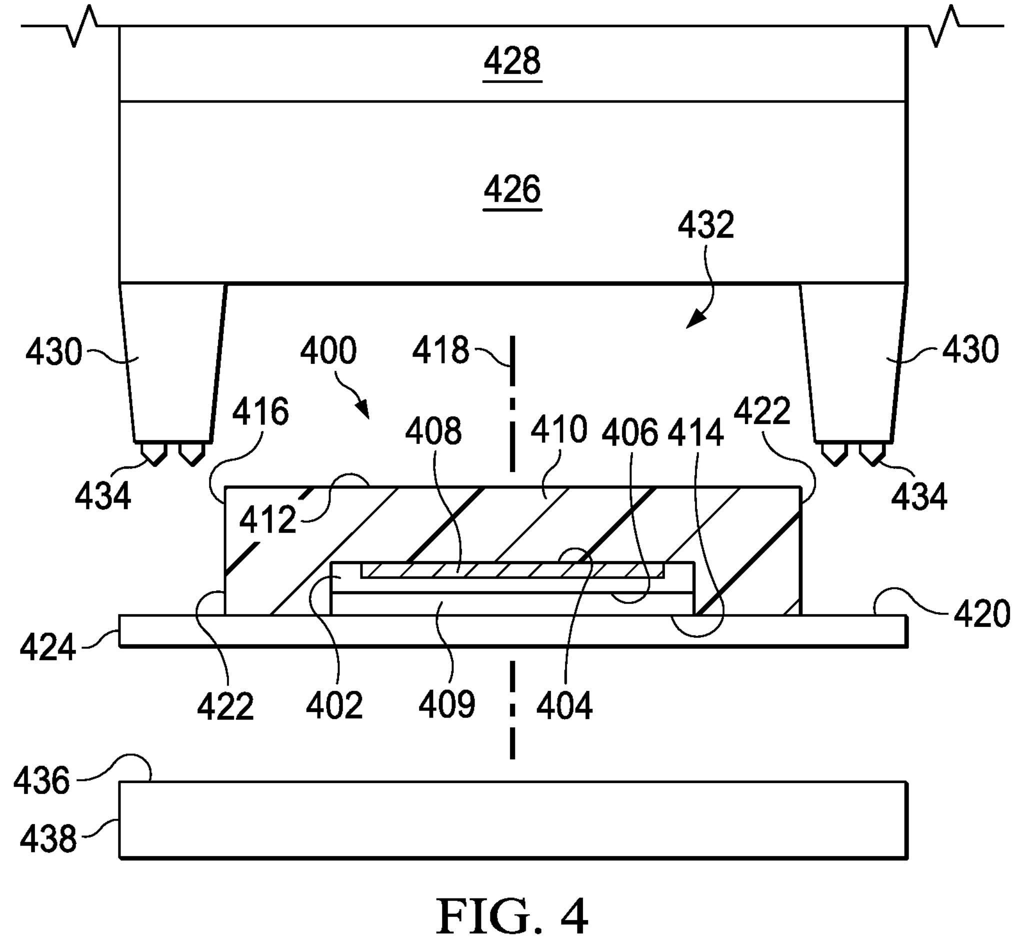
FIG. 4 is a side cross-sectional view of a force sensor for mounting to a member of interest according to some examples.

Referring now to FIG. 4, a force sensor 400 that may be the force sensor 100 of FIG. 1 is shown according to some examples. The force sensor 400 is a semiconductor package that includes a semiconductor die 402. Accordingly, the force sensor 400 may be referred to herein as a "semiconductor package." The semiconductor die 402 has a device side 404 and non-device side 406 opposite the device side 404. An active circuit 408 (or more simply "circuit 408") is formed on the device side 404. The non-device side 406 of semiconductor die 402 is secured to a die pad 409 via a solder paste (not shown).

A mold compound 410 (e.g., a polymer or resin material) may cover the semiconductor die 402 and die pad 409. The mold compound 410 may protect the semiconductor die 402 and die pad 409 from the outside environment (e.g., specifically from dust, liquid, light, contaminants in the outside environment), and may prevent undesired contact with conductive surfaces or members during operations. The mold compound 410 may include a first side 412, a second side 414 opposite first side 412, and an outer perimeter 416 extending between the first side 412 and the second side 414 along an axis 418 that extends through (e.g., perpendicularly through) the sides 412, 414.

The force sensor 400 also includes an interface member 420 that is coupled and positioned along the second side 414 of mold compound 410. The interface member 420 may be an elongate member that extends beyond the outer perimeter 416 of mold compound 410 along one or more sides 422 of the outer perimeter 416. In particular, in some examples the interface member 420 may extend beyond outer perimeter 416 along a pair of opposing sides 422 that are opposite (e.g., radially opposite) one another about axis 418. The portions of interface member 420 that extend beyond outer perimeter 416 may form mounting pads 424 that may be exposed when viewed along axis 418 from the first side 412 of mold compound 410. As was described above for interface member 220, the interface member 420 may be formed of a material that may be joined to another member of surface via an ultrasonic welding process. For instance, the interface member 420 may be formed of a metallic material in some examples. In addition, the interface member 420 (including mounting pads 424) may be formed as a monolithic body that is made up of one continuous piece of material. Further, in some examples the mounting pads 424 may include a pattern of projections such as those shown in FIGS. 3A-3D and described above During operations a welding horn 426 of an ultrasonic welding apparatus 428 (which may be similar to the ultrasonic welding apparatus 110 of FIG. 1) may be pressed against the mounting pads 424 of interface member 420 and vibrated as described above. The welding horn 426 may include multiple engagement members 430 that are spaced from one another to define a receptacle 432. The engagement members 430 include multiple patterned projections or spikes 434 that engage with the mounting pads 424 to transfer vibrations thereto. Specifically, the welding apparatus 428 may be lowered into engagement with force sensor 400 along axis 418 so mold compound 410 is received within receptacle 432 and engagement members 430 are engaged with mounting pads 424 to press the mounting pads 424 against a mounting surface 436 of a member of interest 438 (e.g., shaft 102 in FIG. 1). In addition, the welding apparatus 428 is vibrated and the vibrations are transferred to the mounting pads 424. The pressure and vibrations of the mounting pads 424 against the mounting surface 436 cause the mounting pads 424 and the mounting surface 436 to melt and weld to one another. During this process the interface member 420 conducts the vibrations from welding apparatus 428 away from the mold compound 410, semiconductor die 402, and die pad 409. Accordingly, damage to these components is prevented.

In addition, as was described above for force sensor 200, the engagement of the spikes 434 with mounting pads 424 during the ultrasonic welding process may cause distortion of the mounting pads 424. In particular, the spikes 434 may dig into the mounting pads 424 and thereby form multiple recesses (e.g., recesses 223) therein.

The semiconductor die 402 may be configured to detect forces experienced by the member 438 of interest via the welded connection between the mounting pads 424 and the mounting surface 436. Specifically, the circuit 408 of semiconductor die 402 may detect the forces via piezoresistive changes and may produce an output signal that includes (or is indicative of) the detected forces as described above. The force sensor 400 may include additional components for communicating and/or processing the output from circuit 408 during operations as described above.

Without being limited to this or any other theory, by exposing the mounting pads 424 beyond the outer perimeter 416 of mold compound 410, the welding horn 426 may be lowered axially (e.g., along axis 418) toward first side 412 to contact the mounting pads 424 and perform an ultrasonic welding operation as described. In addition, vibrations experienced by the mounting pads 424 during the ultrasonic welding operation may be transferred through the mounting pads 424 and not the mold compound 410, semiconductor die 402, or die pad 409. Thus, damages to these components of force sensor 400 is reduced during the ultrasonic welding operations described above.

Figure 5:
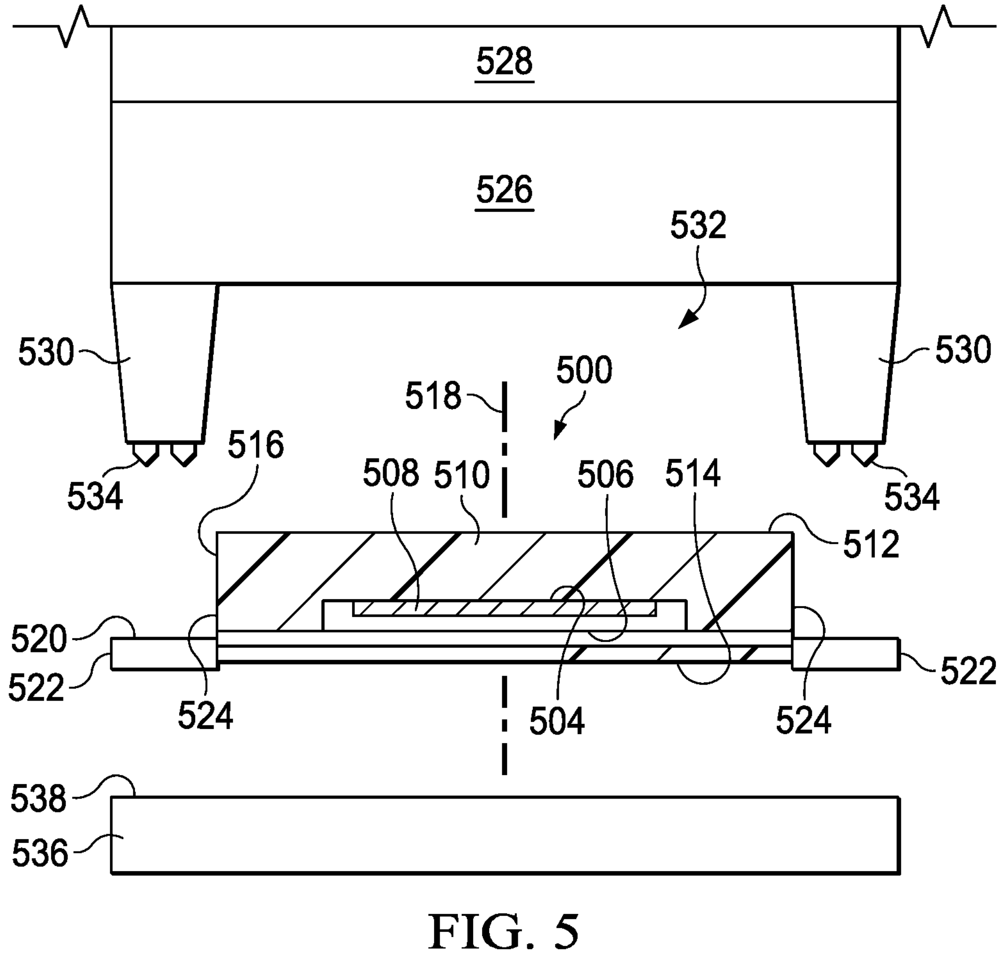
FIG. 5 is a side cross-sectional view of a force sensor for mounting to a member of interest according to some examples.

Referring now to FIG. 5, a force sensor 500 that may be the force sensor 100 of FIG. 1 is shown according to some examples. The force sensor 500 is a semiconductor package that includes a semiconductor die 502. Accordingly, the force sensor 500 may be referred to herein as a "semiconductor package." The semiconductor die 502 has a device side 504 and non-device side 506 opposite the device side 504. An active circuit 508 (or more simply "circuit 508") is formed on the device side 504. The non-device side 506 of semiconductor die 502 is secured to a die pad 509 via a solder paste (not shown).

A mold compound 510 (e.g., a polymer or resin material) may cover the semiconductor die 502 and die pad 509. The mold compound 510 may protect the semiconductor die 502 and die pad 509 from the outside environment (e.g., specifically from dust, liquid, light, contaminants in the outside environment), and may prevent undesired contact with conductive surfaces or members during operations. The mold compound 510 may include a first side 512, a second side 514 opposite first side 512, and an outer perimeter 516 extending between the first side 512 and the second side 514 along an axis 518 that extends through (e.g., perpendicularly through) the sides 512, 514.

The force sensor 500 also includes an interface member 520 that is coupled to and positioned along the second side 514 of mold compound 510. The interface member 520 may have multiple mounting pads 522 that are coupled to the die pad 509 and extend outward from the outer perimeter 516 of mold compound 510. In some examples, the mounting pads 522 may be portions of a lead frame that also includes the die pad 509. The mounting pads 522 extend beyond the outer perimeter 516 of mold compound 510 along one or more sides 524 of the outer perimeter 516. In particular, in some examples the mounting pads 522 may extend beyond outer perimeter 516 along a pair of opposing sides 524 that are opposite (e.g., radially opposite) one another about axis 518. Because the mounting pads 522 extend beyond the outer perimeter 516, the mounting pads 522 may be exposed when viewed along axis 518 from the first side 512 of mold compound 510.

In some examples, the mounting pads 522 may be integrally formed with the die pad 509, so the mounting pads 522 and die pad 509 form a monolithic body that is made up of one continuous piece of material. For instance, the mounting pads 522 and die pad 509 may both be incorporated within a lead frame that is partially covered by mold compound 510 during manufacturing of the force sensor 500. In some examples, the die pad 509 and interface member 520 (including mounting pads 522) may be formed of a metallic material (e.g., copper, aluminum, steel, carbon, etc.). In addition, in some examples the mounting pads 522 may include a pattern of projections such as those shown in FIGS. 3A-3D and described above.

During operations a welding horn 526 of an ultrasonic welding apparatus 528 (which may be similar to the ultrasonic welding apparatus 110 of FIG. 1) may be pressed against the mounting pads 522 of interface member 520 and vibrated as described above. The welding horn 526 may include multiple engagement members 530 that are spaced from one another to define a receptacle 532. The engagement members 530 include multiple patterned projections or spikes 534 that engage with the mounting pads 522 to transfer vibrations thereto. Specifically, the welding horn 526 may be lowered into engagement with force sensor 500 along axis 518 so mold compound 510 is received within receptacle 532 and engagement members 530 are engaged with mounting pads 522 to press the mounting pads 522 against a mounting surface 536 of a member 538 of interest (e.g., shaft 102 in FIG. 1). In addition, the welding horn 526 is vibrated and the vibrations are transferred to the mounting pads 522. The pressure and vibrations of the mounting pads 522 against the mounting surface 536 cause melting and welding of the mounting pads 522 and the mounting surface 536. During this process the interface member 520 conducts the vibrations from welding horn 426 away from the mold compound 510, semiconductor die 502, and die pad 509. Accordingly, damage to these components is prevented.

In addition, as was described above for force sensor 200, the engagement of the spikes 534 with mounting pads 522 during the ultrasonic welding process may cause distortion of the mounting pads 522. In particular, the spikes 534 may dig into the mounting pads 522 and thereby form multiple recesses (e.g., recesses 223) therein.

The semiconductor die 502 may be configured to detect forces experienced by the member 538 of interest via the welded connection between the mounting pads 522 and the mounting surface 536. Specifically, the circuit 508 may detect the forces via piezoresistive changes and may produce an output signal that includes (or is indicative of) the detected forces as described above. The force sensor 500 may include additional components for communicating and/or processing the output from circuit 508 during operations as described above.

Without being limited to this or any other theory, by exposing the mounting pads 522 beyond the outer perimeter 516 of mold compound 510, the welding horn 526 may be lowered axially (e.g., along axis 518) toward first side 512 to contact the mounting pads 522 and perform an ultrasonic welding operation as described. In addition, vibrations experienced by the mounting pads 522 during the ultrasonic welding operation may be transferred through the mounting pads 522 and not the mold compound 510, semiconductor die 502, or die pad 509. Thus, damages to these components of force sensor 500 is reduced during the ultrasonic welding operations described above.

Figure 6:
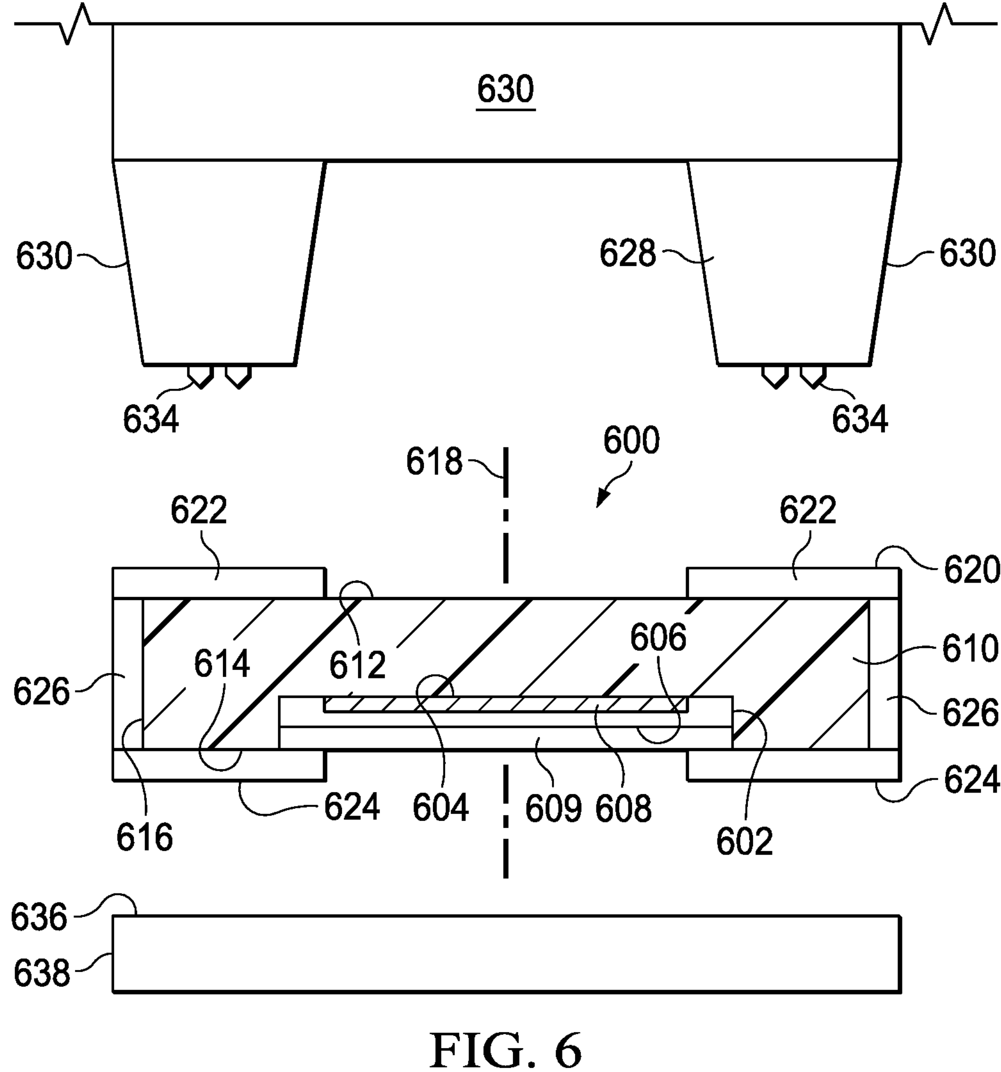
FIG. 6 is a side cross-sectional view of a force sensor for mounting to a member of interest according to some examples.

Referring now to FIG. 6, a force sensor 600 that may be the force sensor 100 of FIG. 1 is shown according to some examples. The force sensor 600 is a semiconductor package that includes a semiconductor die 602. Accordingly, the force sensor 600 may be referred to herein as a "semiconductor package." The semiconductor die 602 has a device side 604 and non-device side 606 opposite the device side 604. An active circuit 608 (or more simply "circuit 608") is formed on the device side 604. The non-device side 606 of semiconductor die 602 is secured to a die pad 609 via a solder paste (not shown).

A mold compound 610 (e.g., a polymer or resin material) may cover the semiconductor die 602 and die pad 609. The mold compound 610 may protect the semiconductor die 602 and die pad 609 from the outside environment (e.g., specifically from dust, liquid, light, contaminants in the outside environment), and may prevent undesired contact with conductive surfaces or members during operations. The mold compound 610 may include a first side 612, a second side 614 opposite first side 612, and an outer perimeter 616 extending between the first side 612 and the second side 614 along an axis 618 that extends through (e.g., perpendicularly through) the sides 612, 614.

The force sensor 600 also includes an interface member 620 that includes a first portion 622 and a second portion 624. The first portion 622 is coupled to and positioned along the first side 612 of mold compound 610, and the second portion 624 is coupled to and positioned along second side 614 of mold compound 610. Thus, the first portion 622 and the second portion 624 are spaced from one another along axis 618 and are positioned on opposing sides of the semiconductor die 602. The first portion 622 and the second portion 624 may be layers of material that are engaged with and may cover the first side 612 and second side 614, respectively, of mold compound 610. In some examples, the first portion 622 and the second portion 624 may cover a portion (e.g., less than all) of the first side 612 and the second side 614, respectively. Specifically, as shown in FIG. 6, the first portion 622 and the second portion 624 may cover a portion of the first side 612 and second side 614, respectively, that extends along the outer perimeter 616. Thus, the first portion 622 and second portion 624 may extend along the outer perimeter 616 along the first side 612 and second side 614, respectively, of mold compound 610. In some examples, the second portion 624 may include a pattern of projections such as those shown in FIGS. 3A-3D and described above.

The interface member 620 also includes multiple connection portions 626 that are coupled to and span (or extend) between the first portion 622 and the second portion 624. The connection portions 626 may extend axially between the first portion 622 and second portion 624 with respect to axis 618. The connection portions 626 extend between the first portion 622 and the second portion 624 along the outer perimeter 616 of mold compound 610. In some examples, the connection portions 626 may form a single, continuous body that extends along the outer perimeter 616 and that is coupled to the first portion 622 and the second portion 624.

During operations a welding horn 628 of an ultrasonic welding apparatus 630 (which may be similar to the ultrasonic welding apparatus 110 of FIG. 1) may be pressed against the first portion 612 and vibrated as described above. The welding horn 628 may include multiple engagement members 630 that are spaced from one another to align with the first portion 622. The engagement members 630 include multiple patterned projections or spikes 634 that engage with the first portion 612 to transfer vibrations thereto. The engagement members 630 may include multiple patterned projections or spikes 634 that engage with the first portion 622 to transfer vibrations thereto. During an ultrasonic welding process, the welding horn 628 is vibrated as it is pressed against the first portion 612, the vibrations are transferred from the first portion 622, through the connection portions 626 to the second portion 624. The pressure and vibrations of the second portion 624 against the mounting surface 636 of a member 638 of interest (e.g., shaft 102 of FIG. 1) cause the mounting surface 634 and second portion 624 to melt and weld to one another.

In addition, the pressure and contact between welding horn 628 and first portion 622 may cause distortion of the first portion 622 during the above-described ultrasonic welding process. In particular, the spikes 634 may dig into the first portion 622 and thereby form multiple recesses (e.g., recesses 223) therein.

The semiconductor die 602 may be configured to detect forces experienced by the member 638 of interest via the welded connection between the second portion 624 and the mounting surface 636. Specifically, the circuit 608 of semiconductor die 602 may detect the forces via piezoresistive changes and may produce an output signal that includes (or is indicative of) the detected forces as described above. The force sensor 600 may include additional components for communicating and/or processing the output from circuit 608 during operations as described above.

Without being limited to this or any other theory, the interface member 620 may conduct the vibrations axially through force sensor 600 without causing damage to the mold compound 610, semiconductor die 602, or die pad 609. Specifically, the interface member 620 is configured to route vibrations from welding horn 628 through connection members 626 to the second portion 624. Thus, the vibrations may bypass the mold compound 610, semiconductor die 602 and die pad 609. In addition, the placement of the first portion 622 along first side 612 of mold compound 610 provides access to the welding horn 628 along axis 618 during welding the force sensor 600 to mounting surface 636.

Figure 7:
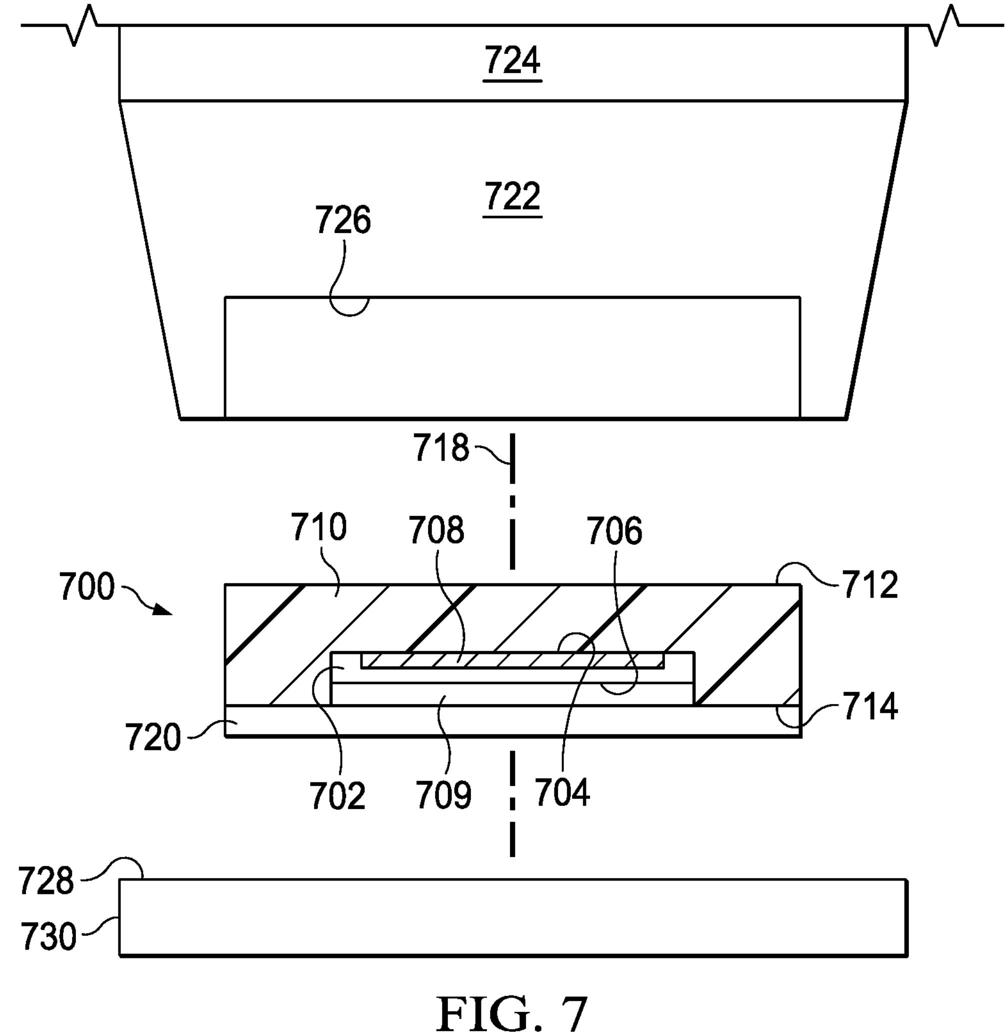
FIG. 7 is a side cross-sectional view of a force sensor for mounting to a member of interest according to some examples.

Referring now to FIG. 7, a force sensor 700 that may be the force sensor 100 of FIG. 1 is shown according to some examples. The force sensor 700 is a semiconductor package that includes a semiconductor die 702. Accordingly, the force sensor 700 may be referred to herein as a "semiconductor package." The semiconductor die 702 has a device side 704 and non-device side 706 opposite the device side 704. An active circuit 708 (or more simply "circuit 708") is formed on the device side 704. The non-device side 706 of semiconductor die 702 is secured to a die pad 709 via a solder paste (not shown).

A mold compound 710 (e.g., a polymer or resin material) may cover the semiconductor die 702 and die pad 709. The mold compound 710 may protect the semiconductor die 702 and die pad 709 from the outside environment (e.g., specifically from dust, liquid, light, contaminants in the outside environment), and may prevent undesired contact with conductive surfaces or members during operations. The mold compound 710 may include a first side 712, a second side 714 opposite first side 712, and an outer perimeter 716 extending between the first side 712 and the second side 714 along an axis 718 that extends through (e.g., perpendicularly through) the sides 712, 714.

The force sensor 700 also includes an interface member 720 that is coupled to and positioned along the second side 714 of mold compound 710. The interface member 720 may be a layer of material that is engaged with and that covers the second side 714 of mold compound 710. In addition, the die pad 709 may be flush with the second side 714 of mold compound 710. Accordingly, the interface member 720 may be engaged with and cover the die pad 709 along second side 714.

During operations a welding horn 722 of an ultrasonic welding apparatus 724 (which may be similar to the ultrasonic welding apparatus 110 of FIG. 1) may be pressed against the first side 712 of mold compound 710 and vibrated as described above. The welding horn 722 may include a receptacle 726 that is shaped and sized to receive the mold compound 710. During an ultrasonic welding process, the welding horn 722 is vibrated as it is pressed against the first side 712, the vibrations are transferred through the mold compound 710 to the interface member 720. The pressure and vibrations of the interface member 720 against a mounting surface 728 of a member 730 of interest (e.g., shaft 102 of FIG. 1) cause the interface member 720 and mounting surface 728 to melt and weld to one another.

The interface member 720 may be formed of any suitable material that may be joined to another member or surface via ultrasonic welding. For instance, in some examples interface member 720 may be formed of a metallic material. In addition, in some examples the interface member 720 may include a pattern of projections such as those shown in FIGS. 3A-3D and described above.

The semiconductor die 702 may be configured to detect forces experienced by the member 730 of interest via the welded connection between the interface member 720 and the mounting surface 728. Specifically, the circuit 708 of semiconductor die 702 may detect the forces via piezoresistive changes and may produce an output signal that includes (or is indicative of) the detected forces as described above. The force sensor 700 may include additional components for communicating and/or processing the output from circuit 708 during operations as described above.

Figure 8:
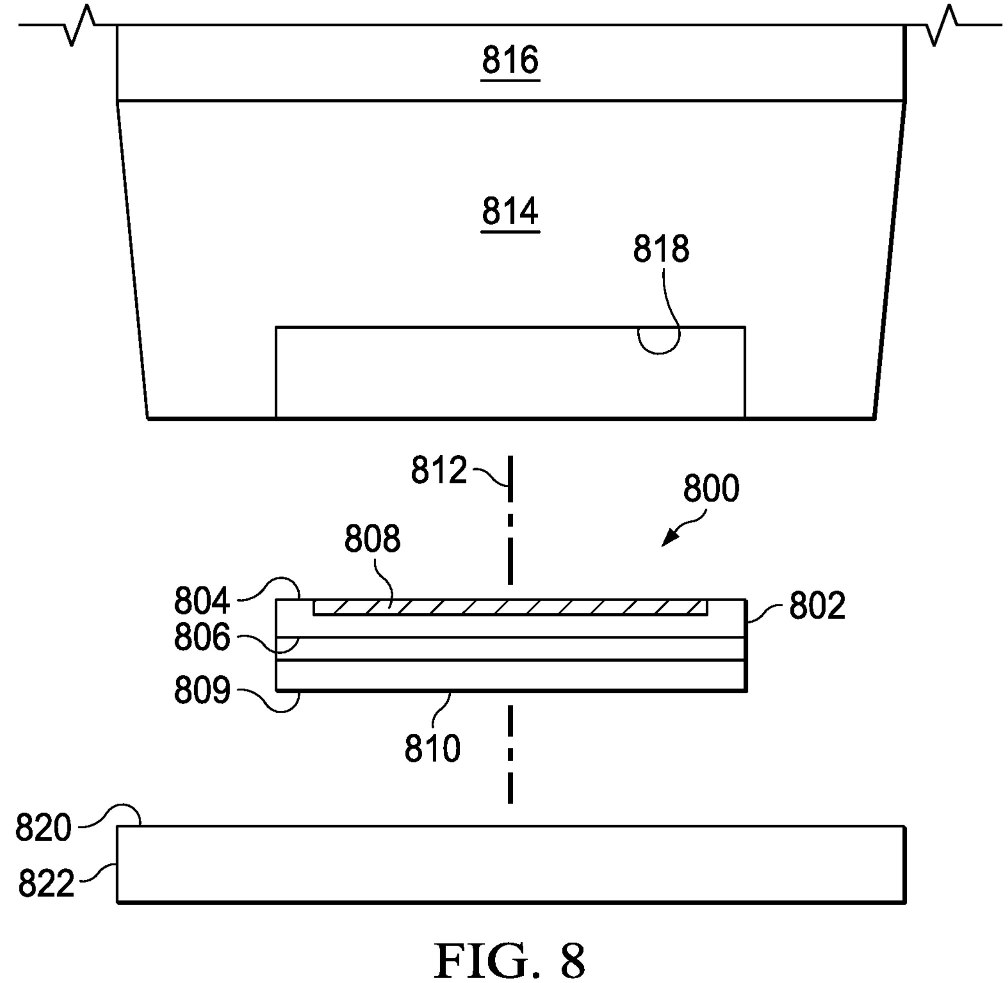
FIG. 8 is a side cross-sectional view of a force sensor for mounting to a member of interest according to some examples.

Referring now to FIG. 8, a force sensor 800 that may be the force sensor 100 of FIG. 1 is shown according to some examples. The force sensor 800 is a semiconductor package that includes a semiconductor die 802. Accordingly, the force sensor 800 may be referred to herein as a "semiconductor package." The semiconductor die 802 has a device side 804 and non-device side 806 opposite the device side 804. An active circuit 808 (or more simply "circuit 808") is formed on the device side 804. The non-device side 806 of semiconductor die 802 is secured to a die pad 809 via a solder paste (not shown).

The force sensor 800 also includes an interface member 810 that is coupled to and positioned along the die pad 809. The interface member 810 may be a layer of material that is engaged with and that covers the die pad 809. The interface member 810 may be positioned on an opposing side of die pad 809 from semiconductor die 802. Accordingly, the die pad 809 may be positioned between the semiconductor die 802 and the interface member 810 along an axis 812 that extends through (e.g., perpendicularly through) the device side 804 and non-device side 806 of semiconductor die 802.

During operations a welding horn 814 of an ultrasonic welding apparatus 816 (which may be similar to the ultrasonic welding apparatus 110 of FIG. 1) may be pressed against the device side 804 of semiconductor die 802 and vibrated as described above. The welding horn 814 may include a receptacle 818 that is shaped and sized to receive the force sensor 800. During an ultrasonic welding process, the welding horn 814 is vibrated as it is pressed against the device side 804, the vibrations are transferred through the semiconductor die 802 and die pad 809 to the interface member 810. The pressure and vibrations of the interface member 810 against a mounting surface 820 of a member 822 of interest (e.g., shaft 102 of FIG. 1) causes the interface member 810 and mounting surface 820 to melt and weld to one another.

The interface member 810 may be formed of any suitable material that may be joined to another member or surface via ultrasonic welding. For instance, in some examples interface member 810 may be formed of a metallic material. In addition, in some examples the interface member 810 may include a pattern of projections such as those shown in FIGS. 3A-3D and described above.

The semiconductor die 802 may be configured to detect forces experienced by the member 822 of interest via the welded connection between the interface member 810 and the mounting surface 820. Specifically, the circuit 808 of semiconductor die 802 may detect the forces via piezoresistive changes and may produce an output signal that includes (or is indicative of) the detected forces as described above. The force sensor 800 may include additional components for communicating and/or processing the output from circuit 808 during operations as described above.

The examples described herein include force sensors including interface members that may be welded to a member of interest (e.g., a rotating shaft, structural beam). In some examples, the force sensors may include a semiconductor die that is configured to detect a force that is experienced by the member of interest through the welded interface member. The interface layer is adapted to facilitate welding to the member of interest while avoiding damage to other portions of the force sensor (e.g., semiconductor die, wire bonds, die pad). Thus, the force sensors may be securely attached to a member of interest, and forces may be more efficiently and accurately transferred thereto.

While examples described herein have included semiconductor packages that function as force sensors (e.g., forces sensors 200, 306, 400, 500, 600, 700, 800), some examples described herein may include semiconductor packages that provide additional and/or different functionality (e.g., other than force sensing). For instance, the semiconductor packages according to examples herein may function as temperature sensors, magnetic sensors (e.g., Hall Effect sensors), or may provide a computational function (e.g., processing). Reference to force sensors is merely an example of the potential functions of the semiconductor packages described herein. Thus, generally speaking, examples described herein may include semiconductor packages having interface members as described herein that may be mounted to a suitable member or surface via an ultrasonic welding process.

In addition, some examples described herein have included a semiconductor die that includes a circuit on a side of the semiconductor die that is opposite the die pad and/or the interface member (or portion thereof) that engages with a mounting surface on a member of interest. However, in some examples, the circuit of the semiconductor die may be placed on a side of the semiconductor die that faces the die pad and/or the interface member (or portion thereof) that engages with a mounting surface on a member of interest. Thus, the specific arrangement and alignment of the circuit described above is merely an example arrangement and alignment of such circuits for examples contemplated herein.

In this description, the term "couple" may cover connections, communications or signal paths that enable a functional relationship consistent with this description. For example, if device A provides a signal to control device B to perform an action, then: (a) in a first example, device A is directly coupled to device B; or (b) in a second example, device A is indirectly coupled to device B through intervening component C if intervening component C does not substantially alter the functional relationship between device A and device B, so device B is controlled by device A via the control signal provided by device A.

A device that is "configured to" perform a task or function may be configured (e.g., programmed and/or hardwired) at a time of manufacturing by a manufacturer to perform the function and/or may be configurable (or reconfigurable) by a user after manufacturing to perform the function and/or other additional or alternative functions. The configuring may be through firmware and/or software programming of the device, through a construction and/or layout of hardware components and interconnections of the device, or a combination thereof.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture by an end-user and/or a third-party.

While certain components may be described herein as being of a particular process technology, these components may be exchanged for components of other process technologies.

Unless otherwise stated, "about," "approximately," or "substantially" preceding a value means +/−10 percent of the stated value. Modifications are possible in the described examples, and other examples are possible within the scope of the claims.

What is claimed is:

1. A semiconductor device, comprising:

a semiconductor die;

a mold compound having a first side and a second side opposite the first side, the mold compound covering the semiconductor die; and an interface member including a first portion and a second portion, the first portion is coupled to the second portion, the first portion is on the first side, the second portion is on the second side, the semiconductor die is on the second portion, and the second portion including a metallic material and having a surface facing away from the semiconductor die, and the surface is configured to melt responsive to a vibration.

2. The semiconductor device of claim 1, wherein the interface member has a connection portion coupled to and extending between the first portion and the second portion.

3. The semiconductor device of claim 2, wherein the first portion, the second portion, and the connection portion form a monolithic body.

4. The semiconductor device of claim 2, wherein the connection portion extends through the mold compound.

5. The semiconductor device of claim 2, wherein the connection portion are external to the mold compound.

6. The semiconductor device of claim 1, wherein the first portion covers the first side of the mold compound and the second portion covers the second side of the mold compound.

7. The semiconductor device of claim 1, wherein the second portion includes a pattern of projections.

8. The semiconductor device of claim 1, wherein the semiconductor die includes a force sensor.

9. The semiconductor device of claim 1, wherein the first portion is directly above the semiconductor die.

10. The semiconductor device of claim 1, wherein the second portion includes a set of protrusions extending away from the semiconductor die.

11. A semiconductor device, comprising:

a semiconductor die including a force sensor;

a mold compound having a first side and a second side opposite the first side, the mold compound covering the semiconductor die;

a first mounting pad on the first side and external to the molding compound, the first mounting pad having a first surface facing away from the semiconductor die and configured to melt responsive to a vibration; and a second mounting pad on the second side and external to the molding compound, the second mounting pad having a second surface facing away from the semiconductor die and configured to melt responsive to a vibration.

12. The semiconductor device of claim 11, wherein the semiconductor die is mounted to a die pad, and the first and second mounting pads are coupled to i the die pad.

13. The semiconductor device of claim 12, wherein the first and second mounting pads and the die pad form a monolithic body.

14. The semiconductor device of claim 12, wherein the first and second mounting pads and the die pad are part of a lead frame.

15. The semiconductor device of claim 11, wherein the first and second mounting pads are deformable by a welding device, or include recesses to engage with the welding device.

16. The semiconductor device of claim 11, wherein the first and second mounting pads are deformable by a welding device, or include recesses to engage with the welding device.

17. A semiconductor device, comprising:

a semiconductor die including a force sensor;

a die pad having opposite first and second surfaces, the semiconductor die mounted on the first surface; and an interface member, at least a portion of the interface member is on the second surface, and the portion has a surface facing away from the die pad, and the surface is configured to melt responsive to a vibration.

18. The semiconductor device of claim 17, wherein the portion is a first portion, the interface member includes a second portion over the semiconductor die, and a connection portion extending between the first portion and the second portion, the connection portion configured to conduct the vibration from the second portion to the first portion.

19. The semiconductor device of claim 18, wherein the first portion, the second portion, and the connection portion form a monolithic body.

20. The semiconductor device of claim 18, comprising a mold compound covering the semiconductor die.

21. The semiconductor device of claim 20, wherein the connection portion extends through the mold compound.

22. The semiconductor device of claim 20, wherein the connection portion extends along an outer perimeter of the mold compound.

23. The semiconductor device of claim 17, wherein the portion includes a set of protrusions extending away from the semiconductor die.

* * * * *